United States Patent
Song et al.

(10) Patent No.: US 9,065,072 B2
(45) Date of Patent: Jun. 23, 2015

(54) ORGANIC LIGHT EMITTING DIODE DISPLAY AND MANUFACTURING METHOD THEREOF

(71) Applicant: SAMSUNG DISPLAY CO., LTD., Yongin, Gyeonggi-do (KR)

(72) Inventors: Seung-Yong Song, Suwon-si (KR); Seung-Hun Kim, Hwaseong-si (KR); Jin-Kwang Kim, Seoul (KR); Cheol Jang, Seoul (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 15 days.

(21) Appl. No.: 13/783,524

(22) Filed: Mar. 4, 2013

(65) Prior Publication Data
US 2014/0048780 A1   Feb. 20, 2014

(30) Foreign Application Priority Data
Aug. 20, 2012  (KR) .................. 10-2012-0090580

(51) Int. Cl.
*H01L 51/52*  (2006.01)
(52) U.S. Cl.
CPC ........ *H01L 51/5253* (2013.01); *H01L 51/5256* (2013.01)
(58) Field of Classification Search
CPC ................... H01L 51/5256; H01L 51/5253
USPC ............. 438/26; 257/100, E51.02, E33.059, 257/E23.002, E21.502
See application file for complete search history.

(56) References Cited

U.S. PATENT DOCUMENTS

| | | | |
|---|---|---|---|
| 2001/0052752 A1* | 12/2001 | Ghosh et al. .............. | 313/512 |
| 2003/0189403 A1* | 10/2003 | Yamada et al. ........... | 313/511 |
| 2006/0250084 A1* | 11/2006 | Cok et al. ................ | 313/512 |
| 2008/0085418 A1* | 4/2008 | Fukuda et al. ............ | 428/447 |
| 2008/0278070 A1* | 11/2008 | Kim .......................... | 313/504 |
| 2010/0178481 A1* | 7/2010 | George et al. ............ | 428/213 |
| 2010/0215929 A1 | 8/2010 | Seo et al. | |
| 2011/0128667 A1* | 6/2011 | Do et al. ................... | 361/305 |
| 2011/0140163 A1* | 6/2011 | Oh et al. ................... | 257/100 |
| 2011/0140164 A1* | 6/2011 | Seo et al. .................. | 257/100 |
| 2011/0163330 A1* | 7/2011 | Kim et al. .................. | 257/88 |
| 2011/0198627 A1* | 8/2011 | Maindron et al. ......... | 257/88 |
| 2011/0204492 A1* | 8/2011 | Xie et al. .................. | 257/635 |
| 2011/0281417 A1* | 11/2011 | Gordon et al. ............ | 438/424 |
| 2012/0132953 A1 | 5/2012 | Becker et al. | |
| 2012/0241811 A1* | 9/2012 | Kim et al. .................. | 257/100 |
| 2012/0245658 A1* | 9/2012 | Pan et al. .................. | 607/88 |
| 2013/0092972 A1* | 4/2013 | Kim et al. .................. | 257/100 |
| 2013/0226268 A1* | 8/2013 | Pan ........................... | 607/88 |
| 2013/0247972 A1* | 9/2013 | Mungekar et al. ........ | 136/256 |
| 2014/0014885 A1* | 1/2014 | Pan et al. .................. | 252/519.21 |

FOREIGN PATENT DOCUMENTS

| | | | |
|---|---|---|---|
| JP | 2007090803 A | * | 4/2007 |
| KR | 10-2008-0024382 A | | 3/2008 |
| KR | 10-2009-0007517 A | | 1/2009 |
| KR | 10-2010-0097514 A | | 9/2010 |
| KR | 10-2012-0001778 A | | 1/2012 |

* cited by examiner

*Primary Examiner* — Joseph C Nicely
(74) *Attorney, Agent, or Firm* — Robert E. Bushnell, Esq.

(57) ABSTRACT

Disclosed are an organic light emitting diode display and a manufacturing method thereof, and, more particularly, an organic light emitting diode display which includes an encapsulation layer including an inorganic layer containing carbon at a level of about 0.2 wt % to about 6.2 wt % and an organic layer and a manufacturing method thereof.

15 Claims, 5 Drawing Sheets

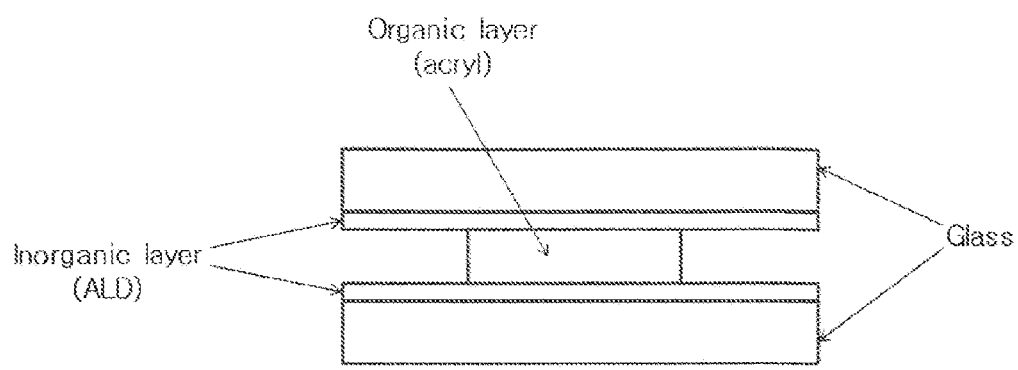

ORGANIC LIGHT EMITTING DIODE DISPLAY AND MANUFACTURING METHOD THEREOF

CLAIM OF PRIORITY

This application makes reference to, incorporates the same herein, and claims all benefits accruing under 35 U.S.C. §119 from an application for ORGANIC LIGHT EMITTING DIODE DISPLAY AND MANUFACTURING METHOD THEREOF earlier filed in the Korean Intellectual Property Office on 20 Aug. 2012 and there duly assigned Serial No. 10-2012-0090580.

BACKGROUND OF THE INVENTION

1. Field of the Invention

The present disclosure relates to an organic light emitting diode display and a manufacturing method thereof, and, more particularly, to an organic light emitting diode display which includes an encapsulation layer including an inorganic layer containing carbon of 0.2 wt % to 6.2 wt % and an organic layer and a manufacturing method thereof.

2. Description of the Related Art

An organic light emitting diode display is a self-emission display device which has an organic light emitting diode which emits light to display an image. Since, unlike a liquid crystal display, the organic light emitting diode display does not require a separate light source, it is possible to reduce a thickness and a weight thereof relative to the thickness and weight required by a liquid crystal display. Further, since the organic light emitting diode display has high-grade characteristics such as low power consumption, high luminance, and a high response speed, the organic light emitting diode display receives attention as a next-generation display device for portable electronic apparatuses.

The organic light emitting diode is an element emitting and dissipating light generated when an electron and a hole are coupled with each other within the diode. Generally, the organic light emitting diode includes an electrode for injecting a hole (anode), an electrode for injecting an electron (cathode), and an emission layer and has a structure in which the emission layer is laminated between a positive electrode, which is the electrode for injecting a hole, and a negative electrode, which is the electrode for injecting an electron. In detail, when the electron is injected from the negative electrode of the organic light emitting diode and the hole is injected from the positive electrode, charges thus generated are moved in opposite directions relative to each other by the external electric field formed by the electrodes and then are coupled with each other in the emission layer to emit light, which is then dissipated from the emission layer. In the organic light emitting diode, the emission layer is made of a single molecular organic material or a polymer.

For example, the organic light emitting diode display (OLED) can be slim and flexible due to its more advantageous driving characteristics, and, as a result, much research relating to OLEDs is presently being conducted.

However, the organic light emitting diode display has the characteristic that the organic light emitting diode is deteriorated by the penetration of oxygen or moisture. Accordingly, in order to prevent oxygen or moisture from penetrating from the outside, an encapsulation structure for sealing and protecting the organic light emitting diode is required.

As the encapsulation structure, a thin film structure which covers the organic light emitting diode by a multilayer in which organic layers and inorganic layers are alternately laminated has been widely adopted. That is, the organic light emitting diode is sealed by alternately laminating the organic and inorganic layers on the organic light emitting diode of the substrate. Here, the organic layer mainly serves to give flexibility to the organic light emitting diode display, and the inorganic layer serves to prevent oxygen or moisture from penetrating.

As a method of forming an inorganic layer in the related art, sputtering, atomic layer deposition (ALD) or the like is used. However, since the formed inorganic layer is made of only an inorganic material, adhesion to the organic layer is weak, and detachment occurs along an interface between the inorganic layer and the organic layer. As a result, there is a problem in that the reliability of the OLED products is deteriorated.

In order to solve this problem, a plasma treatment is performed before and after forming the organic and inorganic layers, reducing the weakness of the adhesion between the organic layer and the inorganic layer. However, when the plasma treatment process is added, there is still a disadvantage in that the processing time is increased.

Accordingly, in order to form a more durable encapsulation layer against penetration of moisture and oxygen, a method of improving through a relatively simple process the adhesion between the organic layer and the inorganic layer while maintaining a barrier characteristic of the inorganic layer has been required.

SUMMARY OF THE INVENTION

The present disclosure has been made in an effort to provide an organic light emitting diode display with a protective barrier excluding oxygen and moisture in which the barrier characteristic is not compromised, the stress within the barrier layer is reduced, and adhesion to organic layers is improved. This is accomplished by controlling the content of carbon when forming an inorganic layer of an OLED encapsulation layer. A manufacturing method thereof is also provided.

An exemplary embodiment of the present disclosure provides an organic light emitting diode display including a substrate, an organic light emitting diode formed on the substrate, and an encapsulation layer formed to cover the organic light emitting diode, the encapsulation layer having a multilayer structure in which inorganic layers and organic layers are alternately laminated, and the inorganic layer containing carbon at a level of about 0.2 wt % to about 6.2 wt %.

The organic light emitting diode may include a first electrode, an organic emission layer, and a second electrode, each of which is sequentially formed.

A protective layer may be further included between the organic light emitting diode and the encapsulation layer.

The inorganic layers and the organic layers may be laminated to form a laminated encapsulating barrier having 2 to 20 layers of each kind.

The organic material forming the organic layer may include one or more materials selected from an acrylic resin, a methacrylic resin, polyisoprene, a vinyl resin, an epoxy resin, a urethane resin, a cellulose resin and a perylene resin.

The inorganic material forming the inorganic layer may include one or more materials selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride (SiON). In this case, the inorganic material may contain carbon at a level of about 0.2 wt % to about 6.2 wt %.

Another exemplary embodiment of the present disclosure provides a manufacturing method of an organic light emitting diode display including preparing a substrate, forming an organic light emitting diode on the substrate, and forming an encapsulation layer so as to cover the organic light emitting diode, the step of forming of the encapsulation layer including forming an inorganic layer and forming an organic layer, the inorganic layer comprising carbon at a level of about 0.2 wt % to about 6.2 wt %.

The step of forming the organic light emitting diode may include forming a first electrode on the substrate, forming an organic emission layer on the first electrode, and forming a second electrode on the organic emission layer.

An additional step of forming a protective layer may be further included following the step of forming the organic light emitting diode and preceding the step of forming the encapsulation layer.

The step of forming the inorganic layer and the step of forming the organic layer may be alternately performed 2 to 20 times each.

The organic material forming the organic layer may include one or more materials selected from an acrylic resin, a methacrylic resin, polyisoprene, a vinyl resin, an epoxy resin, a urethane resin, a cellulose resin and a perylene resin.

In the step of forming the inorganic layer, an atomic layer deposition (ALD) method may be used.

In the step of forming the inorganic layer, the carbon content in the inorganic layer may be controlled by controlling any one of an amount of a precursor, a reaction intensity of plasma, a reaction time of plasma, and chamber pressure. In this case, the plasma reaction may be controlled by controlling the concentrations of $N_2O$ and $O_2$.

The inorganic material may be selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride (SiON).

In an organic light emitting diode display according to an exemplary embodiment of the present disclosure, it is possible to improve adhesion of an inorganic layer to an organic layer while maintaining a barrier characteristic of an inorganic layer in an encapsulation layer of the organic light emitting diode display by controlling the content of carbon contained in the inorganic layer of the encapsulation layer.

Further, in a manufacturing method of an organic light emitting diode display according to an exemplary embodiment of the present disclosure, it is possible to shorten a processing time by eliminating the need for plasma treatment processes before and after forming organic and inorganic layers.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a diagram illustrating a method of testing adhesion that is explained in Experimental Example 5 of the present disclosure.

DETAILED DESCRIPTION OF THE INVENTION

Figure 1:
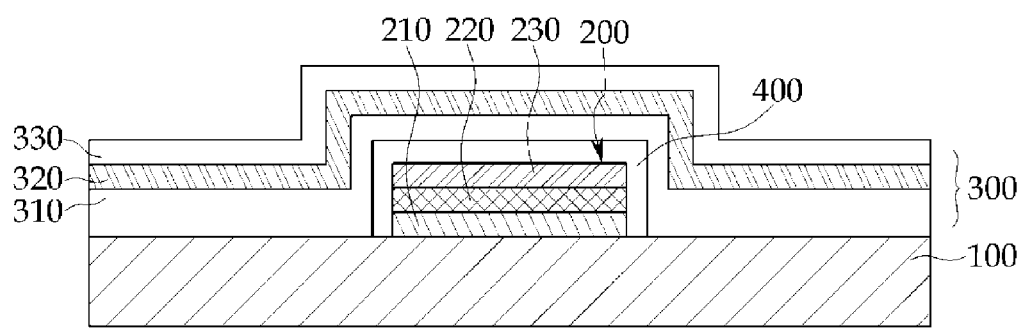
FIG. 1 is a cross-sectional view of an organic light emitting diode display according to an exemplary embodiment of the present disclosure.

Hereinafter, exemplary embodiments of the present disclosure will be described in detail with reference to the accompanying drawings.

Although the present disclosure can be modified variously and have several embodiments, specific exemplary embodiments are illustrated in the accompanying drawings and will be described in the specification. However, the scope of the present disclosure is not limited to the specific embodiments described herein and should be construed as including all the changes, equivalents, and substitutions included in the spirit and scope of the present disclosure.

Terms used in the present disclosure carry their usual meanings within the relevant art, but, in some cases, arbitrarily selected special terms are used, the special terms having meanings understood to be disclosed by the context of their use in the description of the present disclosure.

Parts of the subject OLEDs which are not essential to the description of the present invention are omitted from the description and drawings in order to describe the present invention with greater clarity. Like reference numerals refer to like elements throughout the specification. Further, in the drawings, size and thickness of each element are arbitrarily illustrated for convenience of description, and the present disclosure is not necessarily limited to those embodiments illustrated in the drawings.

In the drawings, the thicknesses of layers and regions are exaggerated for convenience of description. It will be understood that when an element such as a layer, film, region, or substrate is referred to as being "on" another element, it may be "directly on" the other element, or intervening elements may also be present.

FIG. 1 is a cross-sectional view schematically illustrating an organic light emitting diode display according to an exemplary embodiment of the present disclosure.

As illustrated in FIG. 1, an organic light emitting diode display according to an exemplary embodiment of the present disclosure includes a substrate 100, an organic light emitting diode 200 formed above the substrate, and an encapsulation layer 300 formed to cover the organic light emitting diode. The encapsulation layer 300 has a multilayer structure in which inorganic layers 310 and 330 and an organic layer 320 are alternately laminated, and, in this case, the inorganic layers 310 and 330 contain carbon at a level of about 0.2 wt % to about 6.2 wt %. Optionally, a protective layer 400 may be included between the organic light emitting diode 200 and the encapsulation layer 300.

The substrate 100 is selected from a glass substrate and a transparent plastic substrate that has excellent mechanical strength, thermal stability, transparency, surface smoothness, handleability and water repellency. Although not illustrated in FIG. 1, a planarization layer, an insulating layer, and the like may be further provided above the substrate 100, and the substrate 100 may be variously modified.

The organic light emitting diode 200 is provided on the substrate 100. The organic light emitting diode 200 includes a first electrode 210, an organic emission layer 220, and a second electrode 230.

The first electrode 210 may be formed using a vacuum deposition method, a sputtering method, or the like, and may be a cathode or an anode. The first electrode 210 may be selected from a transparent electrode, a translucent electrode, and a reflective electrode and may be formed by using indium tin oxide (ITO), indium zinc oxide (IZO), tin oxide ($SnO_2$), zinc oxide (ZnO), Al, Ag, Mg and the like, but is not limited thereto. Further, the first electrode 210 may have a structure having two layers or more and comprising two or more different materials, and may be variously modified.

The second electrode 230 may be formed using a vacuum deposition method, a sputtering method, or the like, and may be a cathode or an anode. Metal for forming the second electrode may be selected from a metal having low work function, an alloy, an electrically conductive compound, and a mixture thereof. For example, the metal may include lithium (Li), magnesium (Mg), aluminum (Al), aluminum-lithium (Al—Li), calcium (Ca), magnesium-indium (Mg—In), magnesium-silver (Mg—Ag) and the like. Further, the second electrode 230 may have a structure having two layers or more and comprising two or more different materials, and may be variously modified.

The organic emission layer 220 is provided between the first electrode 210 and the second electrode 230. The organic emission layer 220 may include a light emitting material. For example, the light emitting material may contain a host selected from tris-(8-hydroxyquinoline)aluminum ($Alq_3$), 4,4'-(N,N'-dicarbazole)biphenyl (CBP), poly(n-vinylcarbazole) (PVK), and distyrylarylene (DSA) and a dopant selected from red dopants such as platinum(II) octaethylporphine (PtOEP), tris-(1-phenyl-isoquinolinato-C2,N)iridium ($Ir(piq)_3$), bis(2-(2'-benzo[4,5-a]thienyl)pyridinato-N,C3') iridium(acetyl-acetonate) $Btp_2Ir(acac)$, and 4-(dicyanomethylene)-2-t-butyl-6-(1,1,7,7-tetramethyljulolidyl-9-enyl)-4H-pyran (DCJTB), green dopants such as tris(2-phenylpyridine) iridium ($Ir(ppy)_3$), acetylacetonatobis(2-phenylpyridine) iridium (Ir(ppy)2(acac)), and 2-[(4-methylpyridin-2-yl) phenyl]iridium ($Ir(mpyp)_3$), and blue dopants such as bis(4,6-difluorophenylpyridinato-N,C-2')picolinato iridium(III) ($F_2Irpic$), iridium(m)bis[4,6-di-fluorophenyl)-pyridinato-N, C2']picolinate (($F_2ppy)_2Ir(tmd)$), tris[1-(4,6-difluorophenyl) pyrazolate-N,C2']iridium ($Ir(dfppz)_3$), and ter-fluorene, but is not limited thereto.

Although not illustrated in detail in FIG. 1, one or more layers selected from a hole injection layer, a hole transport layer, a hole stop layer, an electron transport layer and an electron injection layer, in addition to the organic emission layer 220, may be further included between the first electrode 210 and the second electrode 230. The hole injection layer, the hole transport layer, the electron transport layer and the electron injection layer may be formed using known materials and known methods.

As illustrated in FIG. 1, protective layer 400 may be provided on the organic light emitting diode 200. Protective layer 400 may be made of a material selected from an organic material and an inorganic material, the protective layer being capable of preventing the second electrode 230 of the organic light emitting diode 200 from being oxidized due to exposure to moisture and oxygen. Further, the protective layer may be formed by an organic/inorganic complex layer and may be variously modified.

Referring to FIG. 1, the encapsulation layer 300 is provided to cover the organic light emitting diode 200 and includes a first inorganic layer 310, a first organic layer 320, and a second inorganic layer 330.

The encapsulation layer 300 may be formed in a multilayer structure in which the organic layers and the inorganic layers are alternately laminated with 2 to 20 layers each, but the respective numbers of the organic layers and the inorganic layers are not limited thereto.

Figure 2:
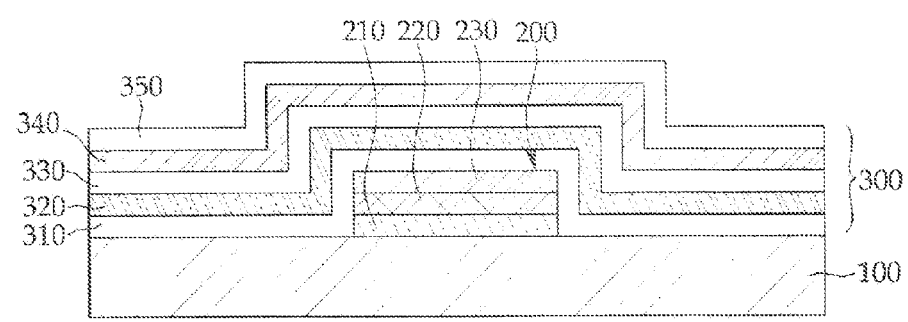
FIG. 2 is a cross-sectional view of an organic light emitting diode display according to another exemplary embodiment of the present disclosure.

As described above, an example of the encapsulation layer formed by alternately laminating the organic layers and the inorganic layers is illustrated in FIG. 2.

The encapsulation layer 300 of the organic light emitting diode display illustrated in FIG. 2 includes a first inorganic layer 310, a first organic layer 320, a second inorganic layer 330, a second organic layer 340, and a third inorganic layer 350. In FIG. 2, the encapsulation layer 300 including the three inorganic layers and the two organic layers is illustrated as an example, but the organic light emitting diode display according to the present disclosure may include an encapsulation layer in which more organic layers and inorganic layers are alternately laminated.

In FIG. 2, a first organic material forming the first organic layer 320 and a second organic material forming the second organic layer 340 may be the same as each other or different from each other. Herein, for convenience of the description, the first organic material forming the first organic layer 320 is described as an example, but other organic layers forming the encapsulation layer 300 may be made of the following arranged organic materials.

The first organic material forming the first organic layer 320 may include one or more materials selected from an acrylic resin, a methacrylic resin, polyisoprene, a vinyl resin, an epoxy resin, a urethane resin, a cellulose resin and a perylene resin.

In more detail, the acrylic resin may be selected from, without limitation, butylacrylate, ethylhexylacrylate and the like, the methacrylic resin may be selected from, without limitation, propyleneglycol methacrylate, tetrahydrofurfuryl methacrylate and the like, the vinyl resin may be selected from, without limitation, vinyl acetate, N-vinylpyrrolidone and the like, the epoxy resin may be selected from, without limitation, cycloaliphatic epoxide, epoxy acrylate, vinyl epoxy resin and the like, the urethane resin may include, without limitation, urethane acrylate and the like, and the cellulose resin may include, without limitation, cellulose nitrate and the like. Similarly, a first inorganic material forming the first inorganic layer 310, a second inorganic material forming the second inorganic layer 330, and a third inorganic material forming the third inorganic layer 350 may be the same as each other or different from each other. For convenience of the description, the inorganic material forming the first inorganic layer 310 is described as an example, but other inorganic layers forming the encapsulation layer 300 may be made of the following inorganic materials.

The first inorganic material forming the first inorganic layer 310 may include one or more materials selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride (SiON).

The inorganic material of the inorganic layers may contain carbon at a level of about 0.2 wt % to about 6.2 wt %. When the carbon content in the inorganic material is less than about 0.2 wt %, adhesion to the organic layer is weak, and, thus, a problem such as layer peeling may occur. When the carbon content in the inorganic material is more than about 6.2 wt %, the rate of occurrence of defects in the form of dark spots is gradually increased, and the ability of the inorganic layer to exclude oxygen and moisture is compromised. Accordingly, in order to improve adhesion of the inorganic layer to the organic layer while maintaining the barrier characteristic of the inorganic layer, the carbon content in the inorganic material forming the inorganic layer is preferably kept in the range of about 0.2 wt % to about 6.2 wt %.

A manufacturing method of an organic light emitting diode display according to an exemplary embodiment of the present disclosure includes preparing a substrate, forming an organic light emitting diode on the substrate, and forming an encapsulation layer to cover the organic light emitting diode. In this case, the step of forming the encapsulation layer includes forming an inorganic layer and forming an organic layer, and the inorganic layer may be formed of an inorganic material containing carbon at a level of about 0.2 wt % to about 6.2 wt %.

The manufacturing method of an organic light emitting diode display according to an exemplary embodiment of the present disclosure will be described in more detail with reference to FIGS. 3A to 3C.

Figure 3A:
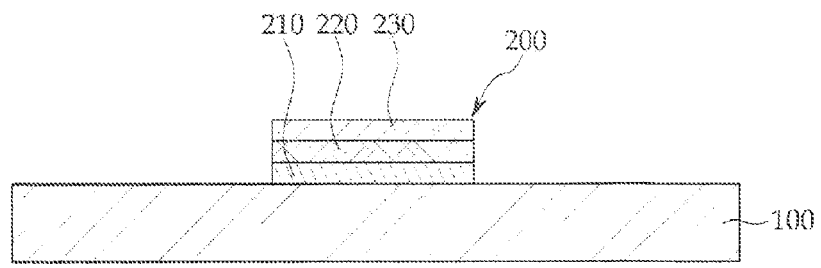
FIGS. 3A to 3C are schematic diagrams for describing a manufacturing method of the organic light emitting diode display according to an exemplary embodiment of the present disclosure.

FIG. 3A illustrates forming an organic light emitting diode 200 on a substrate 100.

The step of forming the organic light emitting diode 200 may include forming a first electrode 210 on the substrate 100, forming an organic emission layer 220 on the first electrode 210, and forming a second electrode 230 on the organic emission layer 220.

A method of forming the first electrode 210, the organic emission layer 220 and the second electrode 230 of the organic light emitting diode 200 may be performed by using known deposition, sputtering, and coating methods. One or more of a hole injection layer, a hole transport layer, an electron transport layer and an electron injection layer may be formed between the first electrode 210 and the second electrode 230, in addition to the organic emission layer 220, which is also disposed between the first electrode 210 and the second electrode 230.

After forming the organic light emitting diode 200 on the substrate 100, the encapsulation layer 300 is formed so as to cover the organic light emitting diode 200. The step of forming the encapsulation layer 300 will be described below in more detail with reference to FIGS. 3B and 3C.

Figure 3B:
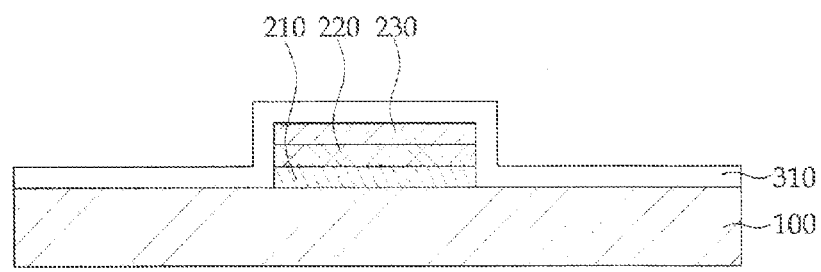

As illustrated in FIG. 3B, a first inorganic layer 310 is formed to cover the organic light emitting diode 200 on the substrate 100, with the organic light emitting diode 200 including the first electrode 210, the organic emission layer 220 and the second electrode 230.

A material forming the first inorganic layer 310 may be chosen from those described above. A method of forming the first inorganic layer 310 may be an atomic layer deposition (ALD) method.

Figure 4:
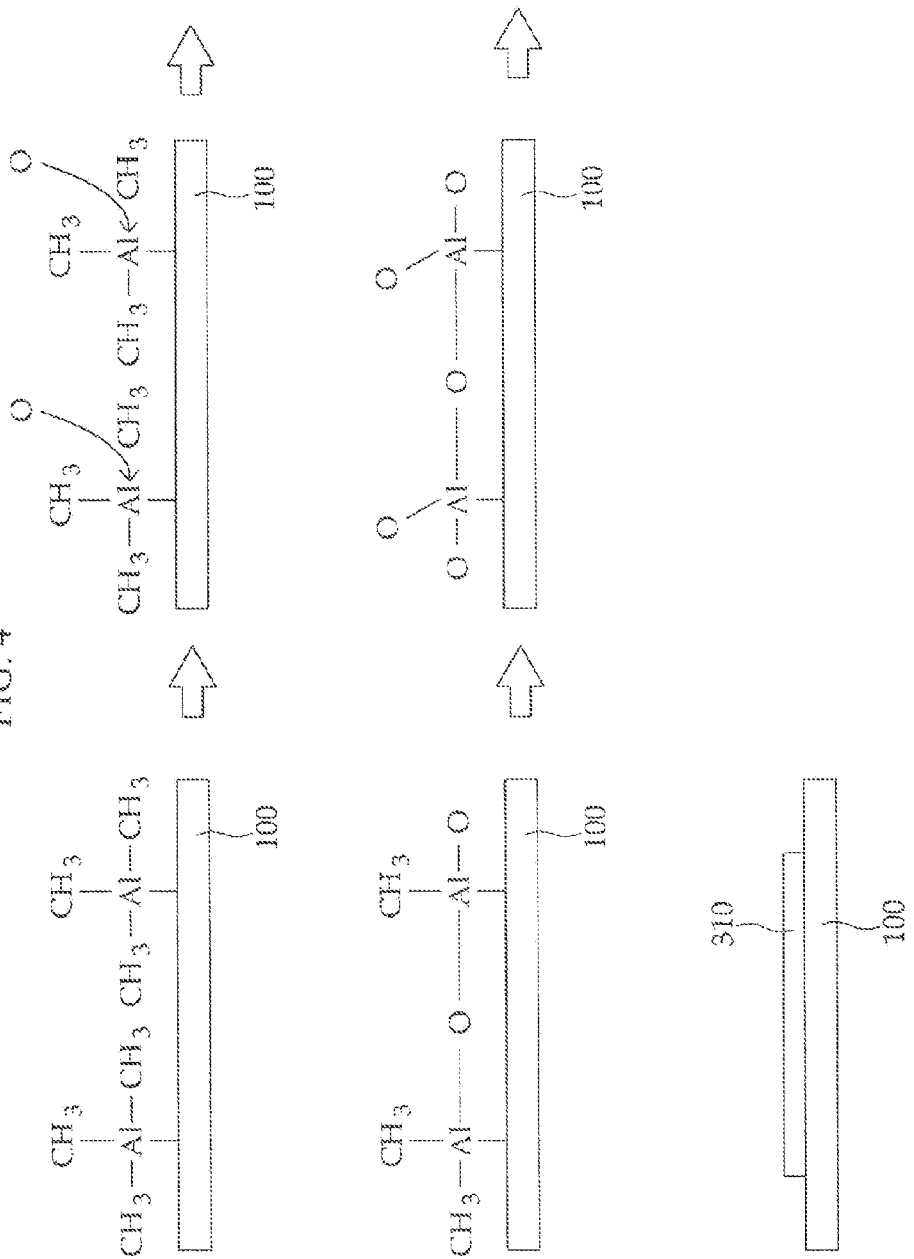
FIG. 4 is a schematic diagram of a process of forming an inorganic layer using an atomic layer deposition method.

FIG. 4 is a schematic diagram illustrating a process of forming an AlOx inorganic layer by using an atomic layer deposition method, and the step of forming the first inorganic layer 310 on the substrate 100 will be described in more detail with reference to FIG. 4.

As illustrated in FIG. 4, in order to form the AlOx inorganic layer, a precursor material comprising an Al-Carbon material is formed on the substrate in a single layer. Thereafter, a bond between Al and Carbon is broken by forming a plasma having an oxygen source, the plasma facilitating the formation of new aluminum-oxygen bonds. The process is repetitively performed to form the AlOx layer having a desired thickness.

As described above, since the adhesion between the AlOx inorganic layer and the organic layer is low, a plasma treatment process is performed before and after deposition in the related art to improve the adhesion between the inorganic layer and the organic layer.

In the manufacturing method according to an exemplary embodiment of the present disclosure, in the step of forming the first inorganic layer 310 using the atomic layer deposition (ALD) method, in order to improve the adhesion between the first inorganic layer 310 and the first organic layer 320, the carbon content may be controlled so as to contain carbon at a level of about 0.2 wt % to about 6.2 wt % in the inorganic material forming the first inorganic layer 310.

The method of controlling the carbon content may include a method of controlling an amount of the precursor, a method of controlling the concentration of a plasma reactant such as one of $O_2$ and $N_2O$ and the duration of exposure to the plasma, a method of controlling chamber pressure, and the like, and, further, may use other methods of controlling the carbon content in the inorganic material as explained in the related art.

By the method as described above, the carbon content of an inorganic layer is controlled by forming an inorganic layer partially containing an organic carbon material, not an inorganic layer made of only a pure inorganic material, and thus adhesion of the inorganic layer to the organic layer is improved, and an inorganic layer having a barrier characteristic capable of preventing moisture and oxygen from penetrating may be formed.

Figure 3C:
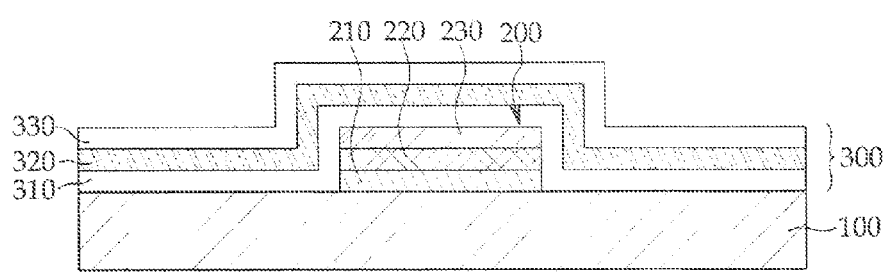

Thereafter, as illustrated in FIG. 3C, the first organic layer 320 and the second inorganic layer 330 are sequentially formed on the first inorganic layer 310.

A material forming the first organic layer 320 may be selected from those described above for an organic layer. The method of forming the first organic layer 320 may variously use general methods of forming a layer, for example, a coating and heat-treatment method, a deposition method, and the like.

The material and the method of forming the second inorganic layer 330 may be the same material and method as employed for the first inorganic layer 310 described above and may be selected from the materials and methods described above.

In FIG. 3C, an example of additionally forming the first organic layer 320 and the second inorganic layer 330 on the first inorganic layer 310 is illustrated, but the step of forming the inorganic layer and the step of forming the organic layer are alternately performed 2 to 20 times each to form the encapsulation layer laminated with multilayered organic and inorganic layers.

Hereinafter, a method of controlling the carbon content according to an exemplary embodiment of the present disclosure will be described in more detail with reference to Experimental Examples.

EXPERIMENTAL EXAMPLES

A substrate with an organic light emitting diode was prepared and then an AlOx inorganic layer was formed so as to cover the organic light emitting diode by performing an atomic layer deposition (ALD) method using trimethyl aluminum (TMA). A method for controlling the carbon content included in the formed AlOx inorganic layer and the result according to the method will be described with reference to the following Experimental Examples 1 to 3.

Experimental Example 1

In order to investigate a possible way to control the carbon content in the AlOx inorganic layer, the carbon content was measured as functions of the flow rates of $N_2O$ and $O_2$, which are plasma reactants. The results are illustrated in the following Tables 1 and 2, respectively.

TABLE 1

| N₂O flow rate (SCCM) | Carbon content in AlOx (wt %) |
| --- | --- |
| 50 | 10.2 |
| 100 | 5.3 |
| 150 | 1.7 |
| 200 | 0.3 |
| 250 | 0.2 |
| 300 | Not measurable |

TABLE 2

| O₂ flow rate (SCCM) | Carbon content in AlOx (wt %) |
| --- | --- |
| 50 | 6.2 |
| 100 | 3.7 |
| 150 | 1.0 |
| 200 | Not measurable |
| 250 | Not measurable |
| 300 | Not measurable |

As illustrated in Tables 1 and 2, in the ALD process, the carbon content in AlOx may be controlled by controlling the flow rate of N₂O and the flow rate of O₂, N₂O and O₂ being the plasma reactants. In detail, as the flow rate of N₂O was increased, the carbon content in AlOx was decreased, and as the flow rate of O₂ was increased, the carbon content in AlOx was decreased.

Experimental Example 2

This example investigates another possible way to control the carbon content in the AlOx inorganic layer. In order to investigate the carbon content of the AlOx inorganic layer as a function of plasma chamber pressure during formation of the inorganic layer, the carbon content was measured over a series of chamber pressures under conditions in which the N₂O plasma gas flow rate was held constant at 200 sccm. The results are illustrated in Table 3.

TABLE 3

| Chamber pressure (mtorr) | Carbon content in AlOx (wt %) |
| --- | --- |
| 1 | 0.2 |
| 10 | 0.2 |
| 100 | 0.3 |
| 200 | 1.1 |
| 300 | 9.8 |
| 500 | 17.3 |

As illustrated in Table 3, as the pressure in the chamber was increased, the carbon content in AlOx was increased.

Experimental Example 3

This example investigates another possible way to control the carbon content in the AlOx inorganic layer. The carbon content in the AlOx inorganic layer resulting from plasma treatment of the TMA-treated substrate was measured as a function of the surface concentration of the TMA prior to plasma treatment. During these experiments, N₂O flow rate was held constant at 200 sccm, N₂O being a plasma reactant, and the chamber pressure was held constant at 10 mtorr. The results are illustrated in Table 4.

TABLE 4

| Amount of TMA (wt %) | Carbon content in AlOx (wt %) |
| --- | --- |
| 1 | 0.1 |
| 5 | 0.1 |
| 10 | 0.6 |
| 20 | 4.8 |
| 50 | 15.6 |

As illustrated in Table 4, as the amount of the TMA was increased, the carbon content in AlOx was increased.

As illustrated in Experimental Examples 1 to 3, the carbon content in AlOx may be controlled by controlling the flow rate of N₂O, the flow rate of O₂, the pressure in the chamber, and the amount of TMA bonded to the substrate surface prior to plasma treatment.

Experimental Example 4

Samples with the ALD layer formed in Experimental Examples 1 to 3 were examined to determine the rate of occurrence of a dark spot defect as a function of the carbon content of the ALD-deposited inorganic layer. The samples were stored for 120 hr in a reliable chamber under conditions of a controlled temperature at 85° C. and a controlled humidity at 85%, and the rate of occurrence of dark spot defects was then determined. The results are illustrated in Table 5.

TABLE 5

| Carbon content in AlOx (wt %) | Defect rate of dark spot (%) (Reliability 120 hr @ 85° C./85% RH) | Note |
| --- | --- | --- |
| 10.2 | 25.3% | |
| 6.2 | 10.0% | |
| 5.3 | 7.8% | |
| 4.8 | 3.4% | |
| 3.7 | 2.9% | |
| 1.7 | 3.5% | |
| 0.2 | 2.3% | |
| 0.2 or less (limit of measurement) | 100 (No light emission of overall cells due to layer lifting) | No light emission |

As illustrated in Table 5, when the carbon content in AlOx was more than 6.2 wt %, the rate of occurrence of the dark spot defects was greatly increased.

Experimental Example 5

Two samples of ALD layers that were formed on glass substrates with control of the carbon contents of the respective ALD layers were subjected to testing of the adhesion between the ALD-deposited inorganic layers and an organic layer which had been interposed between and adhered to each of two of the substrate-bound inorganic ALD layers as illustrated in FIG. 5. A peeling degree was observed, and then the peel adhesion between the respective inorganic layers and the organic layer was measured. The results are illustrated in Table 6.

TABLE 6

| Carbon content in AlOx (wt %) | Adhesion (kgf/mm) (@ 25° C./48% RH) | Note |
| --- | --- | --- |
| 10.2 | 0.86 | |
| 6.2 | 0.81 | |

TABLE 6-continued

| Carbon content in AlOx (wt %) | Adhesion (kgf/mm) (@ 25° C./48% RH) | Note |
|---|---|---|
| 5.3 | 0.83 | |
| 4.8 | 0.82 | |
| 3.7 | 0.79 | |
| 1.7 | 0.79 | |
| 0.2 | 0.75 | |
| 0.2 or less (limit of measurement) | 0.31 | Layer peeling occurs |

As illustrated in Table 6, when the carbon content in AlOx was less than 0.2 wt %, the adhesion between the inorganic layer and the organic layer was weak and thus layer peeling occurred, but when the carbon content was 0.2 wt % or more, the adhesion was good.

Accordingly, in the present disclosure, when the ALD inorganic layer is formed while controlling the carbon content in AlOx to be about 0.2 wt % to about 5 wt %, the function of the ALD inorganic layer as the barrier layer is maintained, the rate of occurrence of the dark spot defects is not large, and the adhesion between the inorganic layer and adjacent organic layers is good. As a result, it is possible to provide an organic light emitting diode display that is not prone to peeling of the inorganic layer.

In the encapsulation layer including the organic layer and the inorganic layer formed by the atomic layer deposition method in the related art, since the adhesion between the inorganic layer and the organic layer is weak, light emission may be occluded due to layer peeling, and an additional plasma process is required before and after forming the layers in order to improve the adhesion.

In contrast, according to an exemplary embodiment of the present disclosure, by controlling the carbon content included in the inorganic layer in the process of forming the inorganic layer by the atomic layer deposition method, the barrier characteristic capable of preventing moisture and oxygen from penetrating may be maintained, adhesion to the organic layer may be improved, and, as a result, the organic light emitting diode display according to the present disclosure may solve problems such as layer peeling and the occurrence of dark spot defects.

Further, by improving the adhesion by controlling the carbon content, since a separate plasma treatment process is not required before and after forming the layers, processing time may be shortened as compared with the manufacturing method of the organic light emitting diode display in the related art, in which plasma treatment was performed before and after forming the layers.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting diode display, comprising:
a substrate;
an organic light emitting diode formed on the substrate; and
an encapsulation layer formed to cover the organic light emitting diode,
the encapsulation layer having a multilayer structure in which inorganic layers and organic layers are alternately laminated, a carbon content of each inorganic layer being kept in a range of about 0.2 wt % to about 6.2 wt %.

2. The organic light emitting diode display of claim 1, the organic light emitting diode including a first electrode, an organic emission layer, and a second electrode, the first electrode, organic emission layer, and second electrode being sequentially formed.

3. The organic light emitting diode display of claim 1, a protective layer being further included between the organic light emitting diode and the encapsulation layer.

4. The organic light emitting diode display of claim 1, the inorganic layers and the organic layers being alternately laminated with 2 to 20 layers.

5. The organic light emitting diode display of claim 1, an organic material forming the organic layer includes one or more materials selected from an acrylic resin, a methacrylic resin, polyisoprene, a vinyl resin, an epoxy resin, a urethane resin, a cellulose resin and a perylene resin.

6. The organic light emitting diode display of claim 1, an inorganic material forming the inorganic layer including one or more materials selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride (SiON).

7. A manufacturing method of an organic light emitting diode display, comprising:
preparing a substrate;
forming an organic light emitting diode on the substrate; and
forming an encapsulation layer so as to cover the organic light emitting diode,
the step of forming the encapsulation layer including forming an inorganic layer and forming an organic layer, a carbon content of the inorganic layer being kept in a range of about 0.2 wt % to about 6.2 wt %.

8. The manufacturing method of an organic light emitting diode display of claim 7, the step of forming the organic light emitting diode including forming a first electrode on the substrate, forming an organic emission layer on the first electrode, and forming a second electrode on the organic emission layer.

9. The manufacturing method of an organic light emitting diode display of claim 7, further comprising forming a protective layer between the step of forming the organic light emitting diode and the step of forming the encapsulation layer.

10. The manufacturing method of an organic light emitting diode display of claim 7, the steps of forming the inorganic layer and forming the organic layer being performed 2 to 20 times each.

11. The manufacturing method of an organic light emitting diode display of claim 7, an organic material forming the organic layer including one or more materials selected from an acrylic resin, a methacrylic resin, polyisoprene, a vinyl resin, an epoxy resin, a urethane resin, a cellulose resin and a perylene resin.

12. The manufacturing method of an organic light emitting diode display of claim 7, an atomic layer deposition (ALD) method being used in the step of forming the inorganic layer.

13. The manufacturing method of an organic light emitting diode display of claim 7, an inorganic material forming the inorganic layer including one or more materials selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxide nitride (SiON).

14. The manufacturing method of an organic light emitting diode display of claim 7, the step of forming the inorganic layer including controlling the carbon content in the inorganic layer by controlling any one of an amount of a precursor, a reaction intensity of plasma, a reaction time of plasma, and chamber pressure.

15. The manufacturing method of an organic light emitting diode display of claim 14, the plasma reaction being controlled by controlling concentrations of $N_2O$ and $O_2$.

* * * * *